United States Patent
Buchholtz et al.

(10) Patent No.: US 7,332,384 B2
(45) Date of Patent: Feb. 19, 2008

(54) TECHNIQUE FOR FORMING A SUBSTRATE HAVING CRYSTALLINE SEMICONDUCTOR REGIONS OF DIFFERENT CHARACTERISTICS

(75) Inventors: Wolfgang Buchholtz, Radebeul (DE); Stephan Kruegel, Boxdorf (DE)

(73) Assignee: Advanced Micro Devices, Inc., Austin, TX (US)

( * ) Notice: Subject to any disclaimer, the term of this patent is extended or adjusted under 35 U.S.C. 154(b) by 138 days.

(21) Appl. No.: 11/099,761

(22) Filed: Apr. 6, 2005

(65) Prior Publication Data

US 2006/0006389 A1    Jan. 12, 2006

(30) Foreign Application Priority Data

Jun. 30, 2004    (DE) ................ 10 2004 031 708

(51) Int. Cl.
*H01L 21/84* (2006.01)
(52) U.S. Cl. .................. 438/150; 257/E21.561; 438/154
(58) Field of Classification Search ............ 438/150, 438/151–166; 257/E21.561
See application file for complete search history.

(56) References Cited

U.S. PATENT DOCUMENTS

| 4,933,298 | A | 6/1990 | Hasegawa ............... 437/62 |
|---|---|---|---|
| 5,371,401 | A | 12/1994 | Kurita ................... 257/524 |
| 5,384,473 | A | 1/1995 | Yoshikawa et al. ...... 257/255 |
| 6,339,232 | B1 | 1/2002 | Takagi .................. 257/192 |
| 6,468,880 | B1 | 10/2002 | Lim et al. ............... 438/459 |
| 6,750,486 | B2 | 6/2004 | Sugawara et al. ....... 257/265 |
| 2002/0019105 | A1 | 2/2002 | Hattori et al. ........... 438/311 |
| 2003/0047782 | A1 | 3/2003 | Hasegawa et al. ....... 257/347 |
| 2004/0075141 | A1 | 4/2004 | Maeda et al. ........... 257/347 |

FOREIGN PATENT DOCUMENTS

WO    WO 2004/114400    12/2004

OTHER PUBLICATIONS

Yang et al., "High Performance CMOS Fabricated on Hybrid Substrate With Different Crystal Orientations," IEEE, 2003, pp. 18.7.1-18.7.4.

*Primary Examiner*—Richard A. Booth
(74) *Attorney, Agent, or Firm*—Williams, Morgan & Amerson, P.C.

(57) ABSTRACT

Different types of crystalline semiconductor regions are provided on a single substrate by forming a dielectric region within a first crystalline semiconductor region. Thereafter, a second crystalline semiconductor region is positioned above the dielectric region by wafer bond techniques. In preferred embodiments, isolation structures may be formed in the first crystalline region along with the dielectric region. In particular, crystalline semiconductor regions of different crystallographic orientations may be formed, wherein a high degree of flexibility and compatibility with currently used CMOS processes is maintained.

17 Claims, 5 Drawing Sheets

TECHNIQUE FOR FORMING A SUBSTRATE HAVING CRYSTALLINE SEMICONDUCTOR REGIONS OF DIFFERENT CHARACTERISTICS

BACKGROUND OF THE INVENTION

1. Field of the Invention

Generally, the present invention relates to the formation of integrated circuits, and, more particularly, to the formation of semiconductor regions of different characteristics, such as different charge carrier mobilities in channel regions of a field effect transistor, on a single substrate.

2. Description of the Related Art

The fabrication of integrated circuits requires the formation of a large number of circuit elements on a given chip area according to a specified circuit layout. Generally, a plurality of process technologies are currently practiced, wherein for complex circuitry, such as microprocessors, storage chips and the like, MOS technology is currently the most promising approach due to the superior characteristics in view of operating speed and/or power consumption and/or cost efficiency. During the fabrication of complex integrated circuits using MOS technology, millions of transistors, i.e., N-channel transistors and/or P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region upon formation of a conductive channel, due to the application of an appropriate control voltage to the gate electrode, depends on the dopant concentration, the mobility of the charge carriers, and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of the MOS transistors. Thus, the reduction of the channel length, and associated therewith the reduction of the channel resistivity, renders the channel length a dominant design criterion for accomplishing an increase in the operating speed of the integrated circuits.

The continuing shrinkage of the transistor dimensions, however, entails a plurality of issues associated therewith that have to be addressed so as to not unduly offset the advantages obtained by steadily decreasing the channel length of MOS transistors. One major problem in this respect is the development of enhanced photolithography and etch strategies to reliably and reproducibly create circuit elements of critical dimensions, such as the gate electrode of the transistors, for a new device generation. Moreover, highly sophisticated dopant profiles, in the vertical direction as well as in the lateral direction, are required in the drain and source regions to provide low sheet and contact resistivity in combination with a desired channel controllability. In addition, the vertical location of the PN junctions with respect to the gate insulation layer also represents a critical design criterion in view of leakage current control. Hence, reducing the channel length also requires reducing the depth of the drain and source regions with respect to the interface formed by the gate insulation layer and the channel region, thereby requiring sophisticated implantation techniques. According to other approaches, epitaxially grown regions are formed with a specified offset to the gate electrode, which are referred to as raised drain and source regions, to provide increased conductivity of the raised drain and source regions, while at the same time maintaining a shallow PN junction with respect to the gate insulation layer.

Since the continuous size reduction of the critical dimensions, i.e., the gate length of the transistors, necessitates the adaptation and possibly the new development of highly complex process techniques concerning the above-identified process steps, it has been proposed to also enhance device performance of the transistor elements by increasing the charge carrier mobility in the channel region for a given channel length, thereby offering the potential for achieving a performance improvement that is comparable with the advance to a future technology node while avoiding many of the above process adaptations associated with device scaling. In principle, at least two mechanisms may be used, in combination or separately, to increase the mobility of the charge carriers in the channel region. First, the dopant concentration within the channel region may be reduced, thereby reducing scattering events for the charge carriers and thus increasing the conductivity. However, reducing the dopant concentration in the channel region significantly affects the threshold voltage of the transistor device, thereby presently making a reduction of the dopant concentration a less attractive approach unless other mechanisms are developed to adjust a desired threshold voltage. Second, the lattice structure, typically a (100) surface orientation, in the channel region may be modified, for instance by creating tensile or compressive stress to produce a corresponding strain in the channel region, which results in a modified mobility for electrons and holes, respectively. For example, creating tensile strain in the channel region increases the mobility of electrons, wherein, depending on the magnitude and direction of the tensile strain, an increase in mobility of 120% or more may be obtained, which, in turn, may directly translate into a corresponding increase in the conductivity. On the other hand, compressive strain in the channel region may increase the mobility of holes, thereby providing the potential for enhancing the performance of P-type transistors. The introduction of stress or strain engineering into integrated circuit fabrication is an extremely promising approach for further device generations, since, for example, strained silicon may be considered as a "new" type of semiconductor material, which may enable the fabrication of fast powerful semiconductor devices without requiring expensive semiconductor materials and manufacturing techniques.

Consequently, it has been proposed to introduce, for instance, a silicon/germanium layer or a silicon/carbon layer in or below the channel region to create tensile or compressive stress that may result in a corresponding strain. Although the transistor performance may be considerably enhanced by the introduction of stress-creating layers in or below the channel region, significant efforts have to be made to implement the formation of corresponding stress layers into the conventional and well-approved MOS technique. For instance, additional epitaxial growth techniques have to be developed and implemented into the process flow to form the germanium or carbon-containing stress layers at appropriate locations in or below the channel region. Hence, process complexity is significantly increased, thereby also increasing production costs and the potential for a reduction in production yield.

Thus, in other approaches, external stress created by, for instance, overlaying layers, spacer elements and the like is used in an attempt to create a desired strain within the channel region. However, the process of creating the strain in the channel region by applying a specified external stress suffers from a highly inefficient translation of the external stress into strain in the channel region, since the channel region is strongly bonded to the buried insulating layer in SOI (silicon-on-insulator) devices or the remaining bulk silicon in bulk devices. Hence, although providing significant advantages over the above-discussed approach requiring additional stress layers within the channel region, the moderately low strain obtained renders the latter approach less attractive.

Recently, it has been proposed to provide so-called hybrid substrates that include silicon regions of two different orientations, that is, a (100) surface orientation and a (110) surface orientation, due to the well-known fact that the hole mobility in (110) silicon is approximately 2.5 times the mobility in (100) silicon. Thus, by providing a (110) channel region for P-channel transistors in CMOS circuits while maintaining the (100) orientation providing a superior electron mobility in the channel regions of the N-channel transistors, the performance of circuits containing both types of transistors may significantly be enhanced for any given transistor architecture. However, the introduction of two types of crystal orientation in a single substrate may require additional complex process steps, thereby rendering this technique possibly less flexible in combination with currently well-established CMOS techniques.

In view of the above-described situation, there exists a need for a flexible technique that enables efficient increase of charge carrier mobility in different substrate areas, while providing a high level of compatibility to current techniques.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the formation of different crystalline semiconductor regions having different characteristics, such as a different crystallographic orientation and/or different strain characteristics and the like, on a common substrate, in accordance with illustrative embodiments, by forming a dielectric region within a semiconductor layer and forming thereon a second semiconductor layer by wafer bonding techniques. Thereby, the characteristics of the first and second semiconductor layers may be adjusted individually on different substrates and/or may be further modified after bonding the second semiconductor layer to the dielectric region.

In a further illustrative embodiment of the present invention, a method comprises forming a dielectric region in a recess formed in a first crystalline semiconductor layer, wherein the first crystalline semiconductor layer is formed above the substrate and has a first characteristic. Furthermore, at least one process operation is preformed to position a second crystalline semiconductor layer above the dielectric region and the first crystalline semiconductor layer, wherein the second crystalline semiconductor layer has a second characteristic that differs from the first characteristic. Finally, a portion of the second crystalline semiconductor layer is removed to expose a portion of the first crystalline semiconductor layer.

According to a further illustrative embodiment of the present invention, a substrate for forming circuit elements thereon comprises a first crystalline semiconductor region having a first characteristic. Moreover, the substrate comprises a dielectric region located laterally adjacent to the first semiconductor region. A second crystalline semiconductor region is formed above the dielectric region and has a second characteristic that differs from the first characteristic. Additionally, an isolation structure is disposed laterally between the first and second crystalline semiconductor regions.

In accordance with yet another illustrative embodiment of the present invention, a semiconductor device comprises a first transistor having a first channel region formed in a first crystalline semiconductor region, wherein the first semiconductor region is defined by a first crystallographic orientation. Moreover, the semiconductor device comprises a second transistor having a second channel region formed in a second crystalline semiconductor region, which is defined by a second crystallographic orientation that differs from the first crystallographic orientation. An isolation structure is formed between the first and second crystalline semiconductor regions and a dielectric region is formed below the first crystalline semiconductor region.

In accordance with a further illustrative embodiment, a substrate comprises a first crystalline semiconductor region having a first crystallographic orientation and a dielectric region located laterally adjacent to the first semiconductor region. A second crystalline semiconductor region is formed above the dielectric region and has a second crystallographic orientation that differs from the first crystallographic orientation. The substrate further comprises an isolation structure disposed laterally between the first and second crystalline semiconductor regions.

BRIEF DESCRIPTION OF THE DRAWINGS

The invention may be understood by reference to the following description taken in conjunction with the accompanying drawings, in which like reference numerals identify like elements, and in which.

Figure 1A:
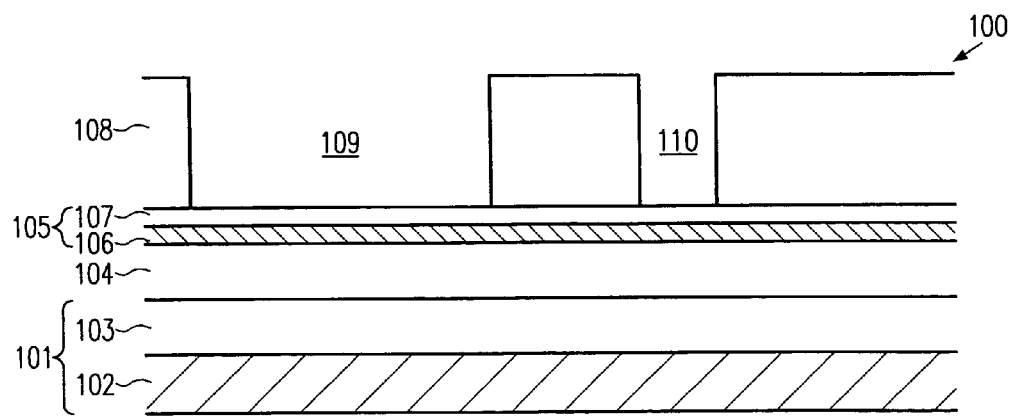
FIGS. 1*a*-1*h* schematically show cross-sectional views of various manufacturing stages in forming a substrate and a semiconductor device having two different crystalline semiconductor regions with different characteristics in accordance with illustrative embodiments.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention is based on the concept that a dielectric region may be formed within a first semiconductor layer, which may act as a place holder above which a second semiconductor layer is to be formed by means of wafer bond techniques. In particular embodiments, the formation of the dielectric region is accomplished by well-established shallow trench isolation (STI) processes, wherein, in some particular embodiments, isolation trenches required in the first semiconductor layer for the further processing of the device may be formed simultaneously with the dielectric region within the first semiconductor layer. With reference to the drawings, further illustrative embodiments of the present invention will now be described in more detail.

FIG. 1a schematically shows a cross-sectional view of a semiconductor device 100 comprising a basic or handle substrate 101, which may include a carrier material layer 102 and an insulating layer 103. In some embodiments, the handle substrate 101 may be completely comprised of a crystalline semiconductor material, such as silicon, having a specified crystallographic orientation. For example, the handle substrate 101 without the insulating layer 103 may represent a crystalline silicon substrate having a (100) orientation or a (110) orientation, since these orientations provide enhanced charge carrier mobility for NMOS devices and PMOS devices, respectively. The semiconductor device 100 further comprises a first crystalline semiconductor layer 104 formed above the handle substrate 101. In the embodiment shown, the layer stack 102, 103 and 104 may represent a silicon-on-insulator (SOI) substrate wherein the insulating layer 103 may represent a buried oxide layer or any other appropriate dielectric layer. When the handle substrate 101 represents a crystalline bulk substrate, the first semiconductor layer 104 may represent an upper layer portion thereof, or may be provided in the form of an epitaxially grown semiconductor layer. It should also be appreciated that the present invention is particularly advantageous when the first crystalline semiconductor layer 104 comprises silicon, as the majority of modern integrated circuits are currently produced on the basis of silicon. However, the principles of the present invention may be readily applied to any semiconductor material that is considered appropriate for the formation of complex circuitry.

The first semiconductor layer 104 is characterized by at least one specified characteristic, such as the type of semiconductor material, the crystallographic orientation thereof, a certain amount of strain, a certain level of dopant concentration, and the like. In particular embodiments, the first semiconductor layer 104 is at least defined by its crystallographic orientation and may represent, in particular examples, crystalline silicon having a surface orientation (100) or (110).

Formed above the first semiconductor layer 104 is a dielectric layer 105, which may be provided in the form of a layer stack including dielectric layers 106 and 107. For example, the dielectric layer 105 may include the layers 106 and 107 in the form of a silicon oxide layer and a silicon nitride layer, respectively. The dielectric layer 105 may, of course, be a single layer of material or include additional layers or layers of different material composition, and may, in particular, include an anti-reflective coating (ARC) having optical characteristics to reduce back reflection in a subsequent photolithography step. A resist mask 108 having formed therein an opening 109 having dimensions that substantially correspond to the dimensions of a recess to be formed within the first semiconductor layer 104 is formed above the dielectric layer 105. In particular embodiments, the resist mask 108 may include one or more openings 110 dimensioned and positioned such that the at least one opening 110 corresponds to the position and size of an isolation trench required for forming circuit elements in and on the first semiconductor layer 104 in a later manufacturing stage.

A typical process flow for forming the semiconductor device 100 as shown in FIG. 1a may comprise the following processes. The handle substrate 101 including the first semiconductor layer 104 may be obtained from wafer manufacturers or may be formed by well-established wafer bond techniques. Thereafter, the dielectric layer 105 may be formed by oxidation and/or deposition techniques, depending on the structure of the dielectric layer 105. For example, the layer 106, when provided in the form of an oxide layer, may be formed by thermal oxidation and/or advanced deposition techniques, such as plasma enhanced chemical vapor deposition (PECVD). The layer 107, when provided in the form of a silicon nitride layer, may be formed by well-established PECVD techniques. The resist mask 108 may be formed in accordance with well-established photolithography techniques including the deposition of an appropriate photoresist by spin-on techniques and the like, followed by pre-bake, exposure, post-bake, and development steps, as may typically be used in an STI formation process.

Figure 1B:
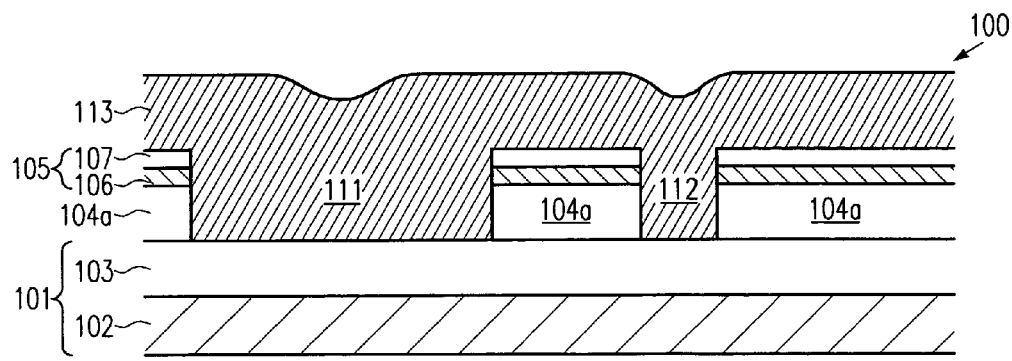

FIG. 1*b* schematically shows the semiconductor device 100 in a further advanced manufacturing stage. The semiconductor device 100 comprises a recess 111 formed in the first semiconductor layer 104 and may also include an isolation trench 112. Moreover, the recess 111 and the isolation trench 112 are substantially completely filled with a dielectric material that is provided in the form of a dielectric layer 113 covering the recess 111, the isolation trench 112, and the remaining portions 104*a* of the first semiconductor layer 104. The recess 111 and the isolation trench 112, if provided, may be formed by well-established etch techniques involving highly anisotropic dry etch processes for removing the layer 107, 105 and finally etch the first semiconductor layer 104. Preferably, the recess 111 and the isolation trench 112 are formed down to the insulating layer 103 to provide enhanced electrical insulation for circuit elements to be formed in and on the portions 104*a* and above the recess 111. However, as previously explained, the handle substrate 101 may represent a bulk semiconductor substrate and the recess 111 and the isolation trench 112 may be etched to a specified depth into the bulk substrate in accordance with device requirements.

Thereafter, the dielectric layer 113 may be deposited by advanced deposition techniques that enable a substantially complete filling of the recess 111 and the isolation trench 112. Since the recess 111 has a significantly larger size than the isolation trench 112, corresponding techniques that may reliably fill the isolation trench 112 in accordance with advanced STI formation techniques also provide for reliable fill capabilities for the recess 111. When the dielectric layer 113 is comprised of silicon dioxide, thermal CVD on the basis of TEOS and oxygen and/or ozone or a high density plasma CVD process may be used possibly in combination with PECVD techniques to form the dielectric layer 113.

Thereafter, the excess material of the dielectric layer 113 may be removed to thereby also planarize the surface topography by means of chemical mechanical polishing (CMP). During the polishing of the layer 113, the dielectric layer 107 may act as a CMP stop layer due to the increased hardness of this layer, when provided as a silicon nitride layer, compared to the dielectric layer 113. Consequently, a substantially planarized surface topography may be obtained with only slight across-surface thickness variations. Thereafter, the residue of the layer 107 may be removed by a selective etch process to expose the layer 106. It should be noted that, in other embodiments, the layer 106 may be omitted and, after removal of the residue of the layer 107, the semiconductor portions 104*a* may be exposed. Thereafter, a thin oxide layer may be formed by thermal oxidation or deposition. In other embodiments, the exposed semiconductor portions 104*a* may remain uncovered to receive a dielectric layer by wafer bonding from a second substrate, as will be described later on.

Figure 1C:
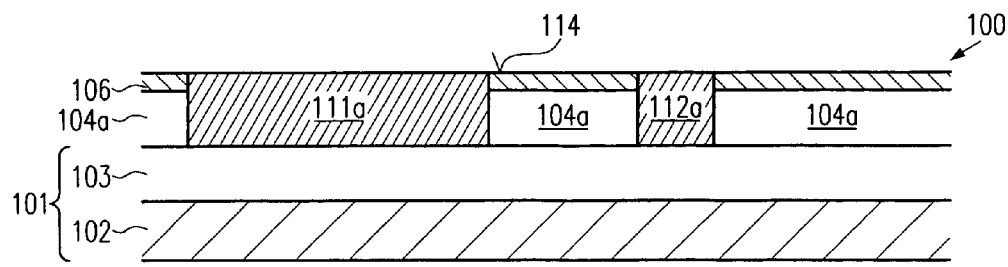

FIG. 1*c* schematically shows the semiconductor device 100 with the recess 111 filled with the dielectric material of the layer 113, thereby forming a dielectric region 111*a*, and with the isolation trench 112 also filled with the dielectric material of the layer 113, thereby forming an isolation structure 112*a*. Moreover, the device 100 comprises a substantially planarized surface 114, which may represent a surface layer comprised of silicon dioxide when the layers 106 and 113 represent silicon dioxide layers. As previously mentioned, the substantially planarized surface 114 may also be formed by completely exposing the portions 104*a*, for instance, by completely omitting the layer 106 or by selectively removing the layer 106 and, associated therewith by also removing surface portions of the dielectric region 111*a* and of the isolation structure 112*a*. In view of superior bond characteristics, it is assumed for the further processing that the surface 114 is substantially comprised of silicon dioxide.

If an enhanced planarity of the surface 114 is considered advantageous, after removal of the residue of the layer 107, the CMP process may be continued to remove the layer 106 or a portion thereof. During this further continued CMP process, any erosion effects that may lead to a slightly recessed surface 114 above the recess 111 may be compensated, at least to a certain degree. Additionally, a further oxide layer may be deposited or formed by thermal oxidation, thereby consuming silicon in the portions 104*a*, while maintaining the "oxide level" in the region 111*a*. Thereafter, the oxide may partially be removed by CMP, thereby obtaining the surface 114 with an increased degree of planarity.

Figure 1D:
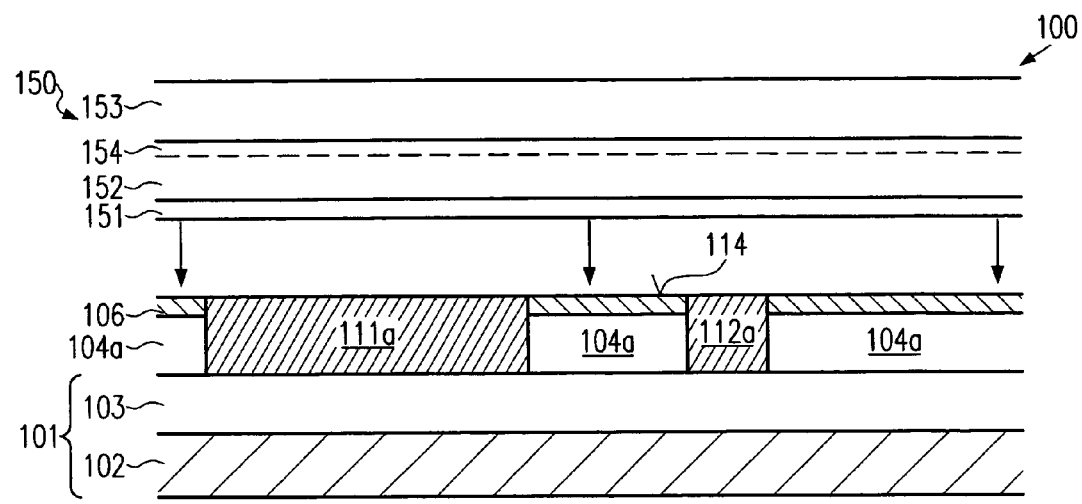

FIG. 1*d* schematically shows the semiconductor device 100 prior to a substrate bonding process for bonding a donor substrate 150 to the surface 114. The substrate 150 comprises a base material 153 that may include a dielectric material or a crystalline semiconductor material on which is formed a second crystalline semiconductor layer 152. The second semiconductor layer 152 is a crystalline layer and is characterized by at least one characteristic, such as type of semiconductor material, crystallographic orientation thereof, strain in the layer 152, and the like. In one particular embodiment, the at least one characteristic represents a crystallographic orientation that differs from the crystallographic orientation of the first semiconductor layer 104. Thus, the second semiconductor layer 152 may represent a silicon layer having a (110) or a (100) orientation, depending on what sort of transistor elements are to be formed on and in the second semiconductor layer 152. Moreover, in one embodiment, the substrate 150 may comprise an insulating layer 151, such as a silicon dioxide layer, formed on top of the second semiconductor layer 152. In particular, the insulating layer 151 is provided on the second semiconductor layer 152 if the semiconductor device 100 comprises exposed surfaces at the semiconductor portions 104*a*, that is, if the layers 107 and 106 are substantially completely removed so that the surface contains the dielectric portions 111*a* and 112*a* and the crystalline portions 104*a*. Furthermore, the substrate 150 may comprise an implantation region 154 at a specified depth to define a cleavage region in order to remove the base material 153 after bonding the substrate 150 to the surface 114.

The substrate 150 may be formed by providing a crystalline semiconductor substrate having the desired crystallographic orientation and implanting an appropriate ion species to form the implantation region 154. For example, hydrogen or helium ions may be implanted with respective implantation energies and doses to center the peak concentration of the ion species at the specified depth. When the insulating layer 151 is desired, the crystalline material 152 may be oxidized and/or an appropriate dielectric material may be deposited, wherein, prior to or after the formation of the insulating layer 151, the ion species may be introduced to form the implantation region 154. Thereafter, the substrate 150 is bonded to the surface 114 with the layer 152 or 151 facing the surface 114 by applying pressure and heat in accordance with well-established bond techniques. In one particular embodiment, the layers 106 and 151 represent silicon dioxide layers, thereby exhibiting excellent adhesion. In another embodiment, the substrate 150 is bonded to the layer 106 without providing the insulating layer 151, thereby immediately placing the second semiconductor layer 152 on the dielectric layer 106. Thereafter, a heat treatment for forming a cleavage region at the implantation region 154 may be performed, or any other process technique may be used to remove the base material 153 from the second semiconductor layer 152 bonded to the surface 114.

Figure 1E:
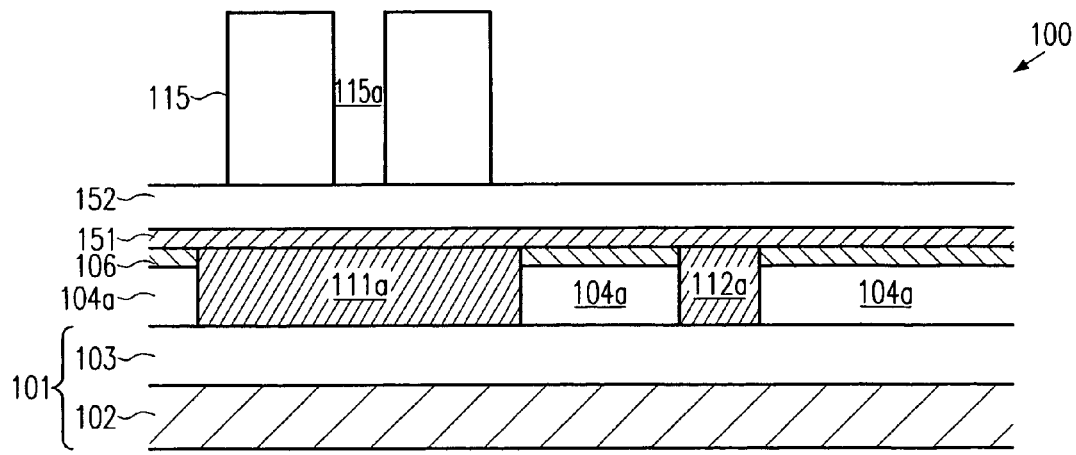

FIG. 1e schematically shows the semiconductor device 100 after the formation of the second semiconductor layer 152 above the dielectric region 111a, the isolation structure 112a and the semiconductor portions 104a with a resist mask 115 that covers a portion of the second semiconductor layer 152. In one particular embodiment, the resist mask 115 may comprise an opening 115a that is positioned and dimensioned to correspond to an isolation trench to be formed in the second semiconductor layer 152 in accordance with design requirements. It should be appreciated that, in some embodiments, a corresponding layer stack (not shown), such as the layer stack 105 in FIG. 1a, may be formed on the second semiconductor layer 152, as is compatible with sophisticated STI formation techniques. Hence, the same criteria apply for this optional layer stack as is previously discussed with reference to the layer stack 105.

By means of advanced photolithography and anisotropic etch techniques, portions of the second semiconductor layer 152 not covered by the resist mask 115 may be removed. Thereafter, a dielectric material, such as silicon nitride and/or silicon dioxide, may be deposited by highly conformal or even flow-like deposition techniques to refill the removed portions of the second semiconductor layer 152. Next, the corresponding surface topography may be planarized by CMP in a similar manner as is described with reference to FIG. 1b. Hence, the patterning of the second semiconductor layer 152 may also be performed on the basis of well-established STI formation techniques wherein, in particular embodiments, corresponding isolation structures may be simultaneously formed within the remaining portions of the layer 152. Furthermore, preferably the resist mask 115 is dimensioned to determine the lateral size of the remaining portion of the second semiconductor layer 152 in such a way that corresponding isolation structures may be formed to insulate the remaining second semiconductor layer 152 from the portions 104a and any semiconductor regions formed thereon, as will be described later on.

Figure 1F:
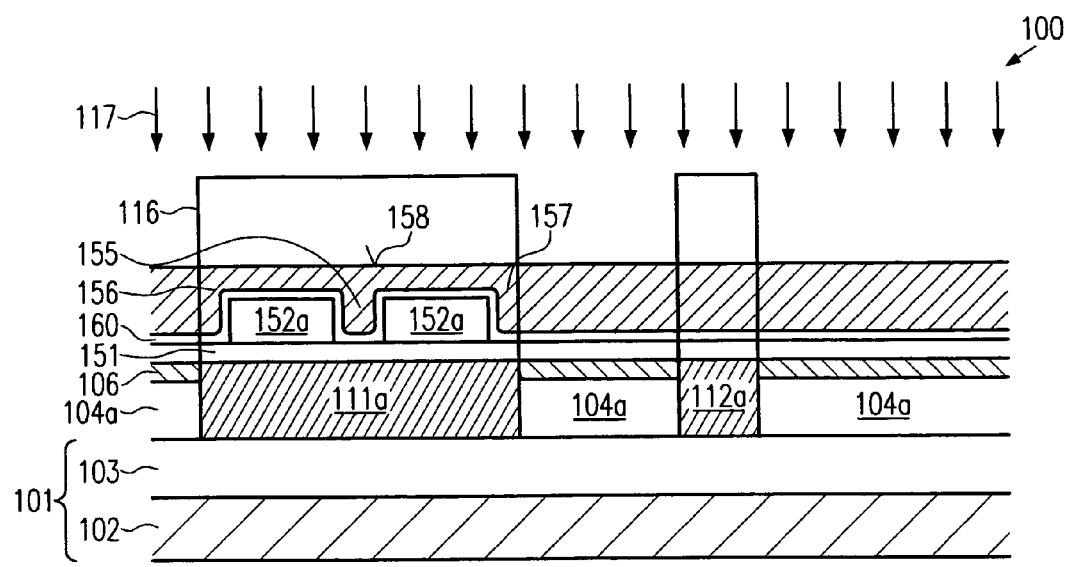

FIG. 1f schematically shows the device 100 after the above-described process sequence. Thus, the device 100 comprises a planarized dielectric layer 156 having a substantially planar surface 158, which encapsulates portions 152a of the second semiconductor layer 152 with an isolation structure 155 formed therebetween. Moreover, a further isolation structure 157 is formed laterally between the portions 104a and the portions 152a. The dielectric layer 156 may be comprised of silicon dioxide, silicon nitride or any other appropriate dielectric material. The dielectric layer 156 may further comprise a liner 160, for instance, comprised of silicon nitride, silicon dioxide and the like. It should be noted that any STI formation process may be employed in forming the device 100 as shown in FIG. 1f. For example, any oxidation processes, or so-called "late liner" processes, may be used to achieve a desired degree of corner rounding in the isolation structures 155 and 157. It should be appreciated that the same also applies to formation of the dielectric region 111a and the isolation structure 112a (FIG. 1b). Furthermore, a resist mask 116 is formed above the dielectric layer 156, which, in turn, may, in some embodiments, include any dielectric layers (not shown) required for performing an advanced lithography process. The resist mask 116 may substantially represent an inverse image of the resist mask 108 (FIG. 1a) for forming the dielectric region 11a and the isolation structure 112a.

After the formation of the resist mask 116, the device 100 may be subjected to an anisotropic etch process 117 to expose the portions 104a of the first semiconductor layer 104. Hereby, the layer 160, if provided, may act as a first etch stop layer after the removal of the bulk material of the layer 156. After opening the layer 157, the etch process 117 may be continued to open the layers 151 and 106, at least partially. During this complex etch step, the etch stop layer 160 provides a substantially uniform etch process, since the etch front may then, after being stopped on the layer 160, reach the portions 104a across various areas of the substrate substantially at the same time. In other cases, after the etch front 117 has stopped on and in the layer 160, the layer 160 may be opened and a portion of the layers 151 and 106 may be removed by anisotropic etching, while the remaining portion may be removed by a correspondingly designed wet chemical etch process, thereby also cleaning the exposed surface areas of the portions 104a. During this wet etch process, a certain amount of the exposed portions 104a may also be removed, thereby also reducing surface contaminants that may negatively influence a subsequent selective epitaxial growth process.

Figure 1G:
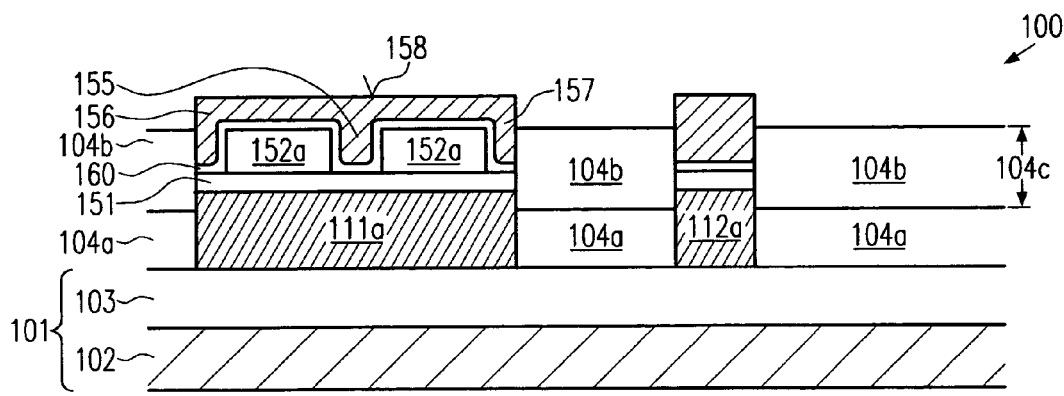

FIG. 1g schematically shows the semiconductor device 100 with epitaxially grown crystalline semiconductor regions 104b formed above the portions 104a by a selective epitaxial growth process. In a selective epitaxial growth process, the deposition parameters are adjusted to achieve adhesion of the deposited semiconductor material at exposed surface portions of the underlying crystalline semiconductor material, while the bonding to the dielectric materials, such as the surface 158, is too weak to permanently deposit material thereon. Corresponding deposition recipes for a selective epitaxial growth, especially for silicon, are well established in the art. In one particular embodiment, the growth parameters are adjusted to obtain a thickness of the grown portions 104b, indicated as 104c, that provides substantially the same height level with respect to the portions 152a. An adequate selection of the process parameters may readily be accomplished since the deposition rate during the epitaxial growth is well-known in advance and the thickness of the layers 151, if provided, the layer 106 and the second semiconductor layer 152 may be known in advance or may be readily determined by well-established inline metrology.

Figure 1H:
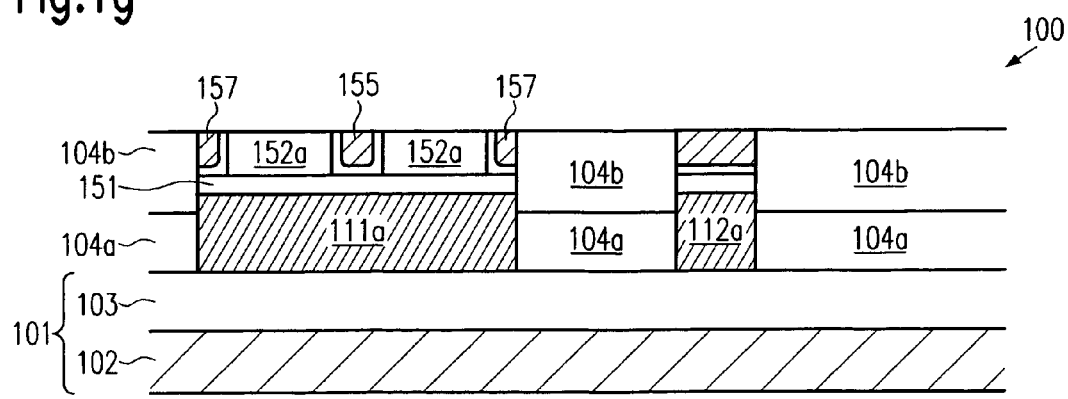

FIG. 1h schematically shows the semiconductor device 100 after removal of surface portions of the layer 156 and after removal of the layer 160, if provided, to expose the portions 152a of the second semiconductor layer 152. Hence, the device 100 comprises the first crystalline semiconductor regions 104b that are characterized by at least one first characteristic, such as a crystallographic orientation, and also comprises the second crystalline semiconductor regions 152a, which are characterized by at least one characteristic that differs from the first characteristic. Moreover, the isolation structure 157 is laterally disposed between the first semiconductor regions 104b and the second semiconductor regions 152a, thereby providing reliable electrical insulation between these two types of semiconductor regions. Moreover, according to design requirements, the first semiconductor regions 104b in combination with the corresponding regions 104a may be separated from each other by the respective isolation structure 112a. Similarly, the second semiconductor regions 152a may be separated by the respective isolation structure 155 in conformity with design requirements. For example, the first semiconductor regions 104b may represent a crystalline silicon region having a (100) surface orientation, while the second semiconductor regions 152a may represent a silicon region having a (110) surface orientation. Thus, the regions 104b may be preferably used for the formation of N-channel transistors, while the regions 152a may be preferably used for the formation of P-channel transistors. Of course, in other embodiments, the regions 104b may represent (110) silicon regions, while the regions 152a may represent (100) silicon regions. In some embodiments, the portions 104b and 152a may differ, alternatively or additionally, in other characteristics, such as type of semiconductor material, dopant concentration, inherent strain and the like. As previously explained, strain engineering of channel regions is becoming more and more important, and hence the regions 104b and/or 152a may be formed to exhibit respective strain components therein. Corresponding techniques for creating strain in the region 104b and/or 152a will be described with reference to FIGS. 2, 3 and 4.

As a result, the semiconductor device 100 may be considered as a substrate for forming semiconductor circuit elements thereon, which provides at least two different types of crystalline semiconductor regions, wherein the specific characteristics of each of the at least two different semiconductor regions may be at least partially adjusted in advance without requiring manufacturing processes that affect the other crystalline semiconductor region.

Figure 1I:
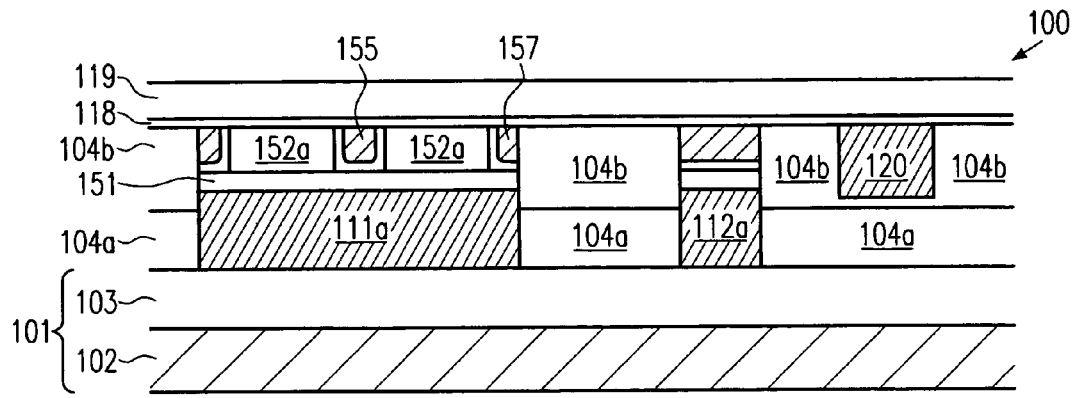
FIG. 1*i* schematically shows the substrate formed in accordance with the preceding embodiments but with at least one third crystalline semiconductor layer having a third characteristic differing from the first and second characteristics.

FIG. 1i schematically shows the semiconductor device 100 in accordance with a further illustrative embodiment in which at least one further crystalline semiconductor region is formed that exhibits a characteristic that differs from the characteristics of the regions 104b and 152a. The device 100 comprises a second dielectric region 120 formed, for instance, in one of the regions 104b in accordance with device requirements. Moreover, a dielectric layer 118 may be formed above the second dielectric region 120 and above the layers 152a and 104b with a third crystalline semiconductor layer 119 formed thereon. With respect to the dielectric layer 118 and the third semiconductor layer 119, substantially the same criteria apply as previously explained with reference to the first and second semiconductor layers 104 and 152 and the corresponding dielectric layers 105 and 151, with the exception that at least one characteristic of the third crystalline semiconductor layer 119 differs from the first and second characteristics. The third semiconductor layer 119 may be formed by wafer bond techniques, as is also explained with reference to FIG. 1d. In this way, a plurality of different types of crystalline semiconductor regions may be formed on a single substrate, thereby offering the potential to meet the material requirements of even extremely sophisticated applications.

Figure 1J:
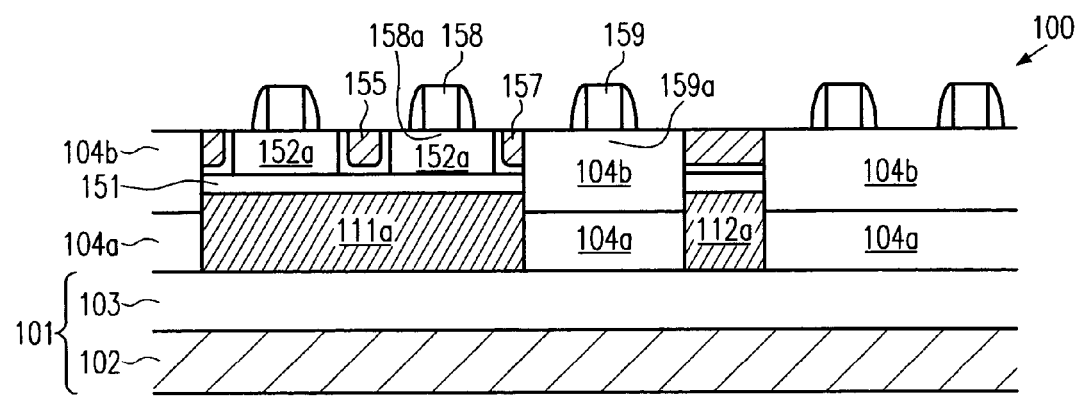
FIG. 1*j* schematically shows a cross-sectional view of a semiconductor device including two different types of crystalline semiconductor regions on which transistor elements are formed in accordance with illustrative embodiments of the present invention.

FIG. 1j schematically shows the semiconductor device 100 when starting from the device as shown in FIG. 1h after having performed a plurality of manufacturing processes to form first circuit elements 159 represented by field effect transistors in and on the portions 104b and second circuit elements 158 represented by field effect transistors in and on the portions 152a. The transistors 159 and 158 may have respective channel regions 159a and 158a, the charge carrier mobility of which is substantially determined by the portions 104b and 152a, respectively. Hence, when starting from the device or substrate 100 as shown in FIG. 1h, substantially conventional CMOS manufacturing processes may be applied without significant modification, while nevertheless obtaining a significant enhancement of circuit performance due to the specifically designed channel regions 158a and 159a, which may individually provide increased charge carrier mobility for P-channel transistors and N-channel transistors, respectively. It should be appreciated, however, that the manufacturing sequence described so far may be readily adapted to any currently used MOS technology, and may also be combined with newly developed manufacturing processes and future device technologies. In particular, the present invention provides a high degree of flexibility in integrating the fabrication of semiconductor substrates having different crystalline regions into specific current or future integration schemes.

Figure 2:
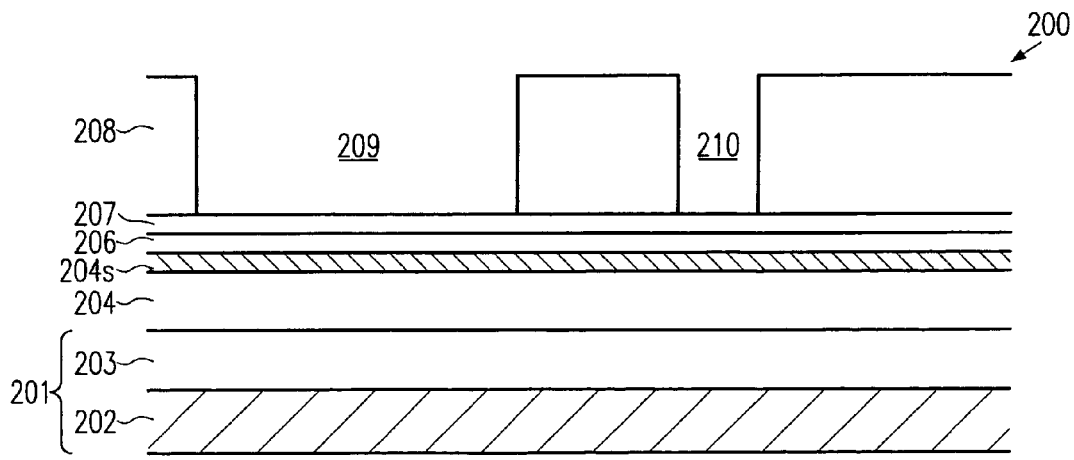
FIG. 2 schematically shows a substrate containing a semiconductor layer with a strain buffer layer on which a strained semiconductor layer may be formed by epitaxial growth after bonding a second semiconductor layer in accordance with embodiments of the present invention.

FIG. 2 schematically shows a semiconductor device 200 that enables the formation of a crystalline semiconductor region having a specified strain. In FIG. 2, the semiconductor device 200 comprises substantially the same components already described with reference to FIG. 1a, wherein identical components are referred to by the same reference numerals, with the exception of a leading "2" instead of a leading "1." Thus, the semiconductor device 200 comprises the handle substrate 201 including, for instance, the layer 202 and the insulating layer 203. Formed thereon is the first semiconductor layer 204, above which the dielectric layers 206 and 207 are located, followed by the resist mask 208 having the openings 209 and 210. Additionally, a crystalline strain buffer layer 204s is provided on the semiconductor layer 204. The strain buffer layer 204s may be comprised of a relaxed semiconductor material having a slightly modified lattice spacing compared to the underlying semiconductor layer 204. For example, the strain buffer layer 204s may be comprised of silicon/germanium or silicon/carbon, and the like, wherein a specified element ratio is selected to achieve the desired strain.

The semiconductor device 200 may be formed in the same fashion as is described with reference to FIG. 1a, wherein the strain buffer layer 204s may be formed by epitaxial growth on the layer 204 with a subsequent relaxation process including the deposition of an appropriate ion species, such as helium, within the semiconductor layer 204 in the vicinity of the layer 204s and a subsequent heat treatment. During this heat treatment, the helium may create voids and thus dislocation loops and dislocation sites to allow the strain buffer layer 204s to relax, thereby adopting its natural lattice spacing.

The further processing of the substrate 200 may continue as is described with reference to FIGS. 1d-1h, wherein the epitaxial growth process described with reference to FIG. 1g then results in a corresponding strained silicon region (the regions 104b in FIG. 1g).

Figure 3:
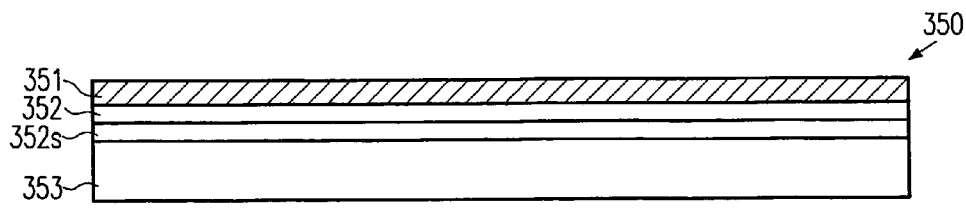
FIG. 3 schematically shows a substrate having formed thereon a strain buffer layer, a second semiconductor layer, and an insulating layer, wherein the insulating layer is to be bonded to another substrate in accordance with further illustrative embodiments of the present invention.

FIG. 3 schematically shows a substrate 350 that is intended to be bonded to a device such as the device formed in accordance with embodiments described with reference to FIGS. 1a-1b, or to a device 200 as described with reference to FIG. 2. Components that are substantially identical to the components of the substrate 150 (FIG. 1d) are denoted by the same reference numeral with the exception of a leading "3" instead of a leading "1." Hence, the substrate 350 comprises the base material 353, a second semiconductor layer 352 formed above the base material 353, and an insulating layer 351 formed on the second semiconductor layer 352. Additionally, a strain buffer layer 352s is formed between the base material 353 and the second semiconductor layer 352. The strain buffer layer 352s may comprise a relaxed semiconductor material having a similar crystalline structure as the base material 353, whereas the second semiconductor layer 352 has a strained crystalline structure due to an epitaxial growth process on the strain buffer layer 352s. For instance the strain buffer layer 352s may be comprised of silicon/germanium or silicon/carbide, and the like, wherein the crystalline base material 353 is silicon. After forming the substrate 350, it may be bonded to a corresponding device, such as the device 100 shown in FIG. 1d, and thereafter the base material 353 and the strain buffer layer 352s may be removed, thereby leaving behind the strained second semiconductor layer 352 that is strongly bonded to the underlying insulator layer 351. Thereafter, the further processing may be continued, as is described with reference to FIG. 1e.

As a result, the embodiments described with reference to FIGS. 2 and 3 enable the formation of different crystalline semiconductor regions, each having a specifically designed strain to further modify the respective charge carrier mobility.

Figure 4A:
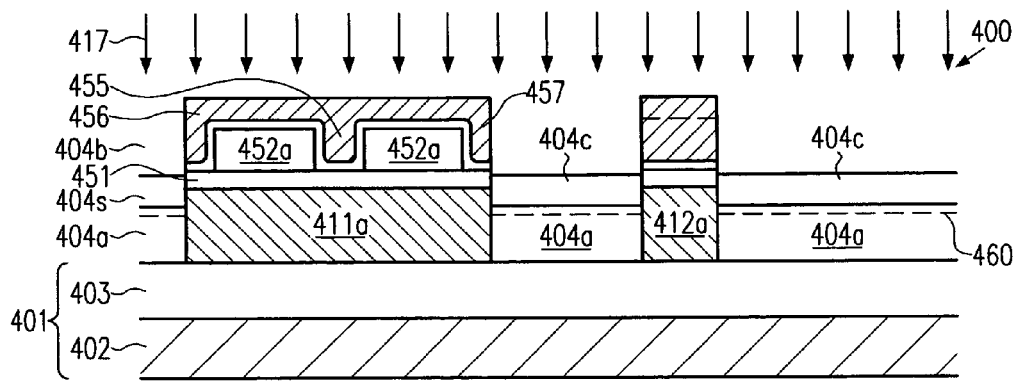
FIGS. 4a-4b schematically show a semiconductor device during various manufacturing stages, wherein a strained first semiconductor layer is formed in the presence of a second semiconductor layer by epitaxial growth using an epitaxially grown strain buffer layer that is subsequently relaxed.

FIG. 4a schematically shows a semiconductor device 400 during a manufacturing stage for forming a specified strain in a semiconductor region. The semiconductor device 400 may substantially comprise the same components as previously described with reference to FIG. 1f, which are designed by the same reference numerals, except for a leading "4" instead of a leading "1." Hence, the semiconductor device 400 comprises the substrate 401 including the layers 402 and 403 having formed thereon the crystalline portions 404a specified by a first characteristic. Moreover, the crystalline portions 452a having a second different characteristic are formed above the dielectric region 411a, wherein the crystalline portions 452a are separated from each other by the isolation structure 455, and are separated from the portions 404a by the isolation structure 457. Moreover, the crystalline portions 404a are separated by the isolation structure 412a. Additionally, a strain buffer layer 404s is formed on the portions 404a, and an implantation region 460 is formed within the portions 404a, wherein the implantation region 460 comprises an appropriate species, such as helium, in an appropriate concentration.

The semiconductor device 400 may be formed in accordance with processes as are also described with reference to FIGS. 1a-1f, wherein additionally after exposure of the portions 404a, the strain buffer layer 404s may be grown by selective epitaxial growth techniques, for instance on the basis of silicon/germanium or silicon/carbon when the portions 404a are comprised of silicon. The implantation region 460 may be formed by ion implantation of, for example, helium ions with a specified dose, implantation time, and implantation energy. Thereafter, the device 400 may be heat treated to relax the strain buffer layer 404s, that is, to create a plurality of dislocation loops and sites within the portions 404a, thereby relaxing the stress in the layer 404s, which then transitions into its natural lattice configuration.

Figure 4B:
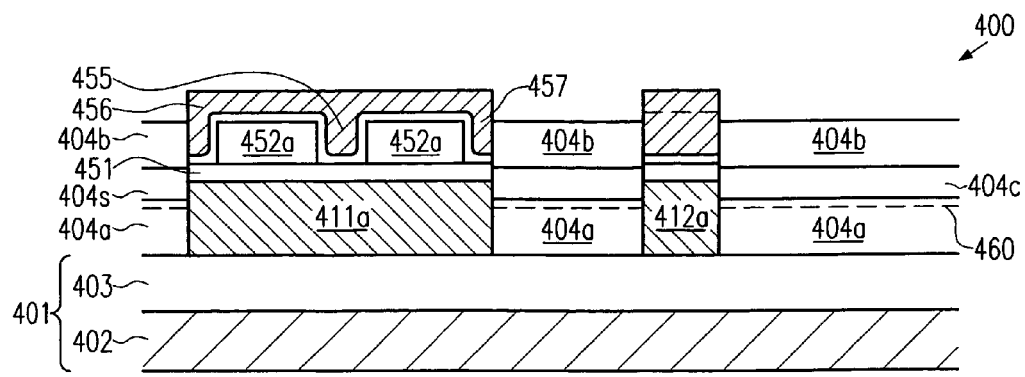

FIG. 4b schematically shows the semiconductor device 400 after a further selective epitaxial growth process, thereby forming corresponding strained semiconductor regions 404b on top of the strain buffer layer 404s. Thus, a specified strain may be created in the regions 404b by adjusting the strain buffer layer 404s, substantially without affecting the characteristics of the semiconductor regions 452a.

As a result, the present invention provides a technique that allows the formation of a plurality of different crystalline semiconductor regions on a single substrate, wherein at least one characteristic of each crystalline semiconductor region may be designed to meet specified design requirements. In particular, different crystallographic orientations may be realized on a single substrate, thereby providing the potential for significantly improving charge carrier mobility of transistor elements formed in the respective crystalline semiconductor regions. However, the present invention also allows specifically designing each crystalline semiconductor region such that it may include a specified strain to further enhance the device performance in addition or alternatively to adapting the crystallographic orientation. Similarly, different semiconductor materials may be used on a single substrate, wherein the preparation of the materials may at least partially be accomplished individually for at least one material. The present invention may not only be applied to the formation of different types of transistor elements, but may also allow the formation of different types of crystalline regions across the entire substrate, thereby offering the potential for enhancing the across-substrate manufacturing uniformity. For example, with the advance of increased substrate diameters in semiconductor fabrication, the across-substrate uniformity of full-substrate processes, such as electroplating, deposition, CMP, and the like may not be able to provide a desired minimal tolerance. In this way, the semiconductor characteristics, such as strain and the like, may be adapted to global substrate non-uniformities to produce integrated circuit chips having a substantially uniform performance. Hereby, well-established process technologies, such as STI schemes, may be used to form the individual different semiconductor regions.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
  forming a dielectric region in a recess formed in a first crystalline semiconductor layer, said first crystalline semiconductor layer being formed above a substrate and having a first characteristic;
  performing at least one process operation to result in the positioning of a second crystalline semiconductor layer above said dielectric region and said first crystalline semiconductor layer, said second crystalline semiconductor layer having a second characteristic differing from said first characteristic; and
  removing a first portion of said second crystalline semiconductor layer to expose a portion of said first crystalline semiconductor layer while leaving a second portion of said second crystalline semiconductor layer disposed above said dielectric region.

2. The method of claim 1, wherein performing at least one process operation to result in the positioning of said second crystalline semiconductor layer above said dielectric region and said first crystalline semiconductor layer comprises providing said second crystalline semiconductor layer on a second substrate and bonding said second substrate to said substrate.

3. The method of claim 1, further comprising selectively epitaxially growing a semiconductor material on said exposed portion of said first crystalline semiconductor layer.

4. The method of claim 1, wherein forming said dielectric region in said recess comprises commonly forming said recess in a first part and an isolation trench in a second part of said first crystalline semiconductor layer.

5. The method of claim 4, further comprising depositing a dielectric material over said first crystalline semiconductor layer to completely fill said recess and said isolation trench and to provide a first layer of dielectric material above said first crystalline semiconductor layer.

6. The method of claim 5, wherein said second substrate having provided thereon said second crystalline semiconductor layer is bonded to said substrate with the second crystalline semiconductor contacting said first layer of dielectric material.

7. The method of claim 2, further comprising forming a second dielectric layer above said second crystalline semiconductor layer and bonding said second substrate with its second dielectric layer to said substrate.

8. The method of claim 7, further comprising forming said second crystalline semiconductor layer with a specified strain prior to forming said second dielectric layer.

9. The method of claim 1, wherein removing a portion of said second crystalline semiconductor layer comprises forming a second isolation trench in a part of said second crystalline semiconductor layer that is located above said dielectric region.

10. The method of claim 9, further comprising removing said portion of the second crystalline semiconductor layer to maintain an isolation region between said exposed portion of the first crystalline semiconductor layer and a remaining portion of the second crystalline semiconductor layer.

11. The method of claim 1, wherein said first crystalline semiconductor layer is a strained layer.

12. The method of claim 3, wherein said first crystalline semiconductor layer comprises a strain buffer layer, and wherein said semiconductor material is selectively grown on said strain buffer layer to form a strained semiconductor layer above said exposed portion of the first crystalline semiconductor layer.

13. The method of claim 3, wherein selectively epitaxially growing said semiconductor material comprises depositing a buffer layer, depositing said semiconductor material on said buffer layer and relaxing said buffer layer to create strain in said deposited semiconductor material.

14. The method of claim 1, wherein said first characteristic represents a first crystallographic orientation and said second characteristic represents a second crystallographic orientation.

15. The method of claim 1, further comprising:
forming a second dielectric region in a recess formed in at least one of the first crystalline semiconductor layer and the second crystalline semiconductor layer;
forming a third crystalline semiconductor layer above said second dielectric region and said first and second crystalline semiconductor layers, said third crystalline semiconductor having a third characteristic differing from said first and second characteristics; and
removing a portion of said third crystalline semiconductor layer to expose a portion of said first and second crystalline semiconductor layers.

16. The method of claim 1, further comprising:
forming a first transistor having a first channel region defined in said first crystalline semiconductor layer; and
forming a second transistor having a second channel region defined in said second semiconductor crystalline layer.

17. The method of claim 1, wherein a portion of the exposed portion of said first crystalline semiconductor layer defines a first device region and a portion of said second crystalline semiconductor layer formed above the dielectric region defines a second device region.

* * * * *